(12) United States Patent
Carlsson

(10) Patent No.: US 9,794,006 B2
(45) Date of Patent: Oct. 17, 2017

(54) ENVELOPE TRACKING RF TRANSMITTER CALIBRATION

(71) Applicant: Telefonaktiebolaget L M Ericsson (publ), Stockholm (SE)

(72) Inventor: Torsten John Carlsson, Lund (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 14/704,122

(22) Filed: May 5, 2015

(65) Prior Publication Data

US 2015/0326327 A1    Nov. 12, 2015

Related U.S. Application Data

(60) Provisional application No. 62/094,366, filed on Dec. 19, 2014, provisional application No. 61/990,392, filed on May 8, 2014.

(51) Int. Cl.
*H04B 17/13* (2015.01)
*H04B 1/04* (2006.01)
(Continued)

(52) U.S. Cl.
CPC .......... *H04B 17/13* (2015.01); *H03F 1/0222* (2013.01); *H03F 1/3241* (2013.01); *H03F 3/195* (2013.01);
(Continued)

(58) Field of Classification Search
CPC .................. H04B 17/13; H04B 17/11; H04B 2001/0416; H04B 2001/0408;
(Continued)

(56) References Cited

U.S. PATENT DOCUMENTS

| 6,765,436 B1 * | 7/2004 | Melanson | H03F 3/181 330/10 |
| 7,602,244 B1 * | 10/2009 | Holmes | H03F 1/0266 330/149 |

(Continued)

FOREIGN PATENT DOCUMENTS

GB    2500708 A    10/2013

OTHER PUBLICATIONS

Luns Tee, "Transmitter Linearization for Portable Wireless Communication Systems", Dissertation for Doctor of Philosophy, University of California, Apr. 2007.*

*Primary Examiner* — Aristocratis Fotakis
(74) *Attorney, Agent, or Firm* — Coats & Bennett, PLLC

(57) ABSTRACT

An envelope tracking RF transmitter calibration procedure calculates both a supply voltage to apply to a power amplifier for a modulated signal envelope to achieve ISO-gain, and a timing delay adjustment to time-align the applied supply voltage and the modulated signal to minimize distortion due to time delay error. An ISO-gain surface is calculated, as a function of the envelope of a modulated signal and the power amplifier supply voltage, for each of a plurality of desired gain values. As the envelope is swept through a predetermined range of values, demodulated outputs at predetermined points are sampled, and a set of non-linear functions relating the supply voltage to the envelope, which achieve the desired gain at the sampled points, are derived, using surface interpolation between the predetermined gain surface points. Data defining the functions are stored for use during transmitter operation. Distortion components in the transmitter output are detected, and are separated into even components representing time delay error distortion, and odd components representing transmit- (Continued)

ter saturation distortion. A timing delay value is calculated that minimizes the time delay error distortion.

45 Claims, 9 Drawing Sheets

(51) Int. Cl.
*H03F 1/02* (2006.01)
*H03F 1/32* (2006.01)
*H03F 3/195* (2006.01)
*H03F 3/24* (2006.01)

(52) U.S. Cl.
CPC ............ *H03F 3/245* (2013.01); *H04B 1/04* (2013.01); *H03F 2200/102* (2013.01); *H03F 2200/111* (2013.01); *H04B 2001/0416* (2013.01)

(58) Field of Classification Search
CPC ............ H03F 1/0222; H03F 1/3241; H03F 2200/375; H03F 2200/451; H04L 27/366
See application file for complete search history.

(56) References Cited

U.S. PATENT DOCUMENTS

| | | | | |
|---|---|---|---|---|
| 2006/0050810 | A1* | 3/2006 | Haque et al. .................. | 375/297 |
| 2007/0015474 | A1* | 1/2007 | Heinikoski ........... | H03F 1/3241 455/126 |
| 2007/0184793 | A1* | 8/2007 | Drogi .................... | H03F 1/0205 455/127.1 |
| 2009/0045872 | A1* | 2/2009 | Kenington .......... | H04B 1/0475 330/127 |
| 2009/0302941 | A1* | 12/2009 | Wimpenny .......... | H03F 1/0227 330/199 |
| 2010/0060358 | A1* | 3/2010 | Nentwig ...................... | 330/199 |
| 2011/0122919 | A1* | 5/2011 | Levita .......................... | 375/130 |
| 2011/0274210 | A1 | 11/2011 | Chekhovstov et al. | |
| 2012/0200354 | A1* | 8/2012 | Ripley .................. | H03F 1/0227 330/131 |
| 2012/0229208 | A1* | 9/2012 | Wimpenny .......... | H03F 1/0227 330/127 |
| 2012/0306572 | A1* | 12/2012 | Hietala .................... | H03F 1/32 330/131 |
| 2012/0326777 | A1 | 12/2012 | Onishi | |
| 2013/0076418 | A1 | 3/2013 | Belitzer et al. | |
| 2013/0235949 | A1 | 9/2013 | Jeckeln | |
| 2014/0057684 | A1* | 2/2014 | Khlat ............................ | 455/574 |
| 2014/0099907 | A1* | 4/2014 | Chiron ........................ | 455/115.2 |
| 2014/0155128 | A1* | 6/2014 | Dakshinamurthy et al. | 455/574 |
| 2014/0179250 | A1* | 6/2014 | Shute .................... | H03F 1/0244 455/127.2 |
| 2015/0017933 | A1* | 1/2015 | McCallister ......... | H04B 1/0475 455/114.3 |
| 2015/0126141 | A1* | 5/2015 | Arno .......................... | 455/114.3 |
| 2015/0280674 | A1* | 10/2015 | Langer ................. | H03G 3/3042 375/295 |
| 2016/0142078 | A1* | 5/2016 | Wang .................. | H04L 27/2615 375/297 |
| 2016/0164550 | A1* | 6/2016 | Pilgram ................... | H03F 3/19 375/295 |
| 2016/0173030 | A1* | 6/2016 | Langer ................. | H03F 1/0222 330/291 |
| 2016/0182100 | A1* | 6/2016 | Menkhoff ........... | H04B 1/0475 375/297 |

* cited by examiner

ENVELOPE TRACKING RF TRANSMITTER CALIBRATION

RELATED APPLICATIONS

This application claims priority to U.S. Provisional Patent Application Ser. No. 61/990,392, filed May 8, 2014, and 62/094,366, filed Dec. 19, 2014, the disclosures of which are incorporated by reference herein, in their entireties.

FIELD OF INVENTION

The present invention relates generally to RF transmitters, and in particular to a system and method to calibrate an envelope tracking power modulated RF transmitter to minimize distortion.

BACKGROUND

Mobile electronic communication devices including cellular telephones, pagers, smartphones, remote monitoring and reporting devices, and the like have dramatically proliferated with advances in the state of the art of wireless communication networks. Many such devices are powered by one or more batteries, which provide a Direct Current (DC) voltage. One challenge to powering electronic communication devices from batteries is that the battery does not output a stable DC voltage over its useful life (or discharge cycle) but rather the DC voltage decreases until the battery is replaced or recharged. Also, many electronic communication devices include circuits that operate at different voltages. For example, the Radio Frequency (RF) circuits of a device may require power supplied at a different DC voltage than digital processing circuits.

A DC-DC converter is an electrical circuit typically employed to convert an unpredictable battery voltage to one or more continuous, regulated, predetermined DC voltage levels, and thus to provide stable operating power to electronic circuits. Numerous types of DC-DC converters are known in the art. The term "buck" converter is used to describe a DC-DC converter that outputs a lower voltage than the DC source (such as a battery); a "boost" converter, also called a step-up, is one that outputs a higher voltage than its DC input.

Supplying power to an RF power amplifier of an electronic communication device is particularly challenging. The efficiency of an RF power amplifier varies with the RF signal amplitude. Maximum efficiency is achieved at full power, and the efficiency drops rapidly as the RF signal amplitude decreases, due to transistor losses accounting for a higher percentage of the total power consumed. The loss of efficiency may be compensated by a technique known as "envelope tracking," in which the output of a DC-DC converter, and hence the voltage supplied to the power amplifier, is not constant, but is modulated to follow the amplitude of the RF signal. In this manner, at any given moment, the power supplied to the RF power amplifier depends on the amplitude of the signal being amplified.

FIG. 1 depicts the relevant portions 10 of the RF circuit of a mobile electronic communication device, some of which may for example be implemented on an RF ASIC within the device. Depicted in FIG. 1 are a baseband and RF transmitter circuit 12, a Power Amplifier (PA) 14 providing an RF transmission signal to an antenna 16, a Power Management Unit (PMU) 18 supplying a dynamically varying supply voltage to the PA 14, and a transmitter measurement receiver and baseband circuit 20. Note that the division and grouping of circuit elements in FIG. 1 is functional and reflects important concepts in the envelope tracking operation discussed here. In a given implementation, the RF transmitter circuit 12 and transmitter measurement receiver circuit 20 may be grouped together, and the baseband functions may be implemented separately, such as in a digital signal processor (DSP) or baseband ASIC.

Within the baseband and RF transmitter circuit 12, an RF signal U(t) is generated by a digital modulator 22. Alternatively for example, during calibration procedures describe herein—the RF signal U(t) may be generated by a test signal generator 24. In either case, the RF signal is conditioned by signal conditioning block 26, and then flows along two parallel processing paths. An RF signal processing path 28 conditions and prepares the RF signal for amplification for transmission. In parallel, an envelope tracking processing path 30 extracts and processes the amplitude envelope of the RF signal, providing the instantaneous signal amplitude to the PMU 18 for the dynamic generation of supply power to the PA 14.

In the RF signal processing path 28, the gain of the RF signal is controlled in gain control block 32, and its delay is controlled in delay control block 34. The RF signal is further conditioned in signal conditioning block 36, and the In-phase and Quadrature components are separately converted to the analog domain by the IQ DAC 38. A low pass filter 40 isolates the RF signal from harmonics and other artifacts, and a mixer 42 generates a modulated carrier signal by mixing the RF signal with the output of a local oscillator (not shown). The modulated carrier signal is amplified by the PA 14 for transmission from the antenna 16.

To optimize the efficiency of the PA 14, its instantaneous power supply level is matched to the RF signal amplitude by processing the RF signal in the envelope tracking processing path 30. An envelope extraction block 44 extracts the RF signal envelope, which is scaled by the envelope tracking scaler block 46. The RF signal envelope is pre-distorted to compensate for known non-linarites using a Look-Up Table (LUT) 48, and the envelope delay is controlled by a delay control block 50. The RF signal envelope is converted to the analog domain by the ET DAC 52. A low pass filter 54 isolates the RF signal envelope from harmonics and other artifacts, and the processed and delay-controlled RF signal envelope is output to the PMU 18. The PMU 18 dynamically adjusts the supply voltage output to the PA 14 based on the RF signal envelope, to maximize the efficiency of the PA 14.

In the transmitter measurement receiver and baseband circuit 20, a receiver block 56 receives an RF signal output by the PA 14, and which is transmitted to the antenna 16. The receiver block 56 performs low-noise amplification, filtering, frequency down-conversion, signal processing, and analog to digital conversion. The transmitter measurement receiver baseband block 58 demodulates and decodes the received signal, and provides digital samples to a digital baseband block 60 for analysis, such as processing received test signals during PMU 18 calibration.

The transmission operations, the PMU 18 must be calibrated in such a way that for all relevant scenarios the PA 14 will minimize distortion and maximize power efficiency. This calibration typically comprises two steps: first, the non-linear relationship between the PA 14 supply voltage and RF signal envelop is determined; then the supply voltage provided by the PMU 18 is time synchronized with the modulated RF signal as it reaches the PA 14. Calibration of the non-linear relationship between the PA 14 supply voltage and RF signal envelope is conventionally performed using an iterative tuning algorithm at a selected number of envelope points. Time synchronizing the PMU 18 supply voltage output with the modulated RF signal at the amplifier is conventionally performed using an iterative tuning algorithm minimizing third order distortion products.

However, Iterative algorithms require iteratively controlling hardware to collect and analyze data, which takes a long time to perform. The use of envelope points (i.e., an RF signal with constant envelope) can create thermal problems during calibration. It is not possible to directly estimate time error during time synchronization. Finally, non-time-related distortion will mask time distortion.

The Background section of this document is provided to place embodiments of the present invention in technological and operational context, to assist those of skill in the art in understanding their scope and utility. Unless explicitly identified as such, no statement herein is admitted to be prior art merely by its inclusion in the Background section.

SUMMARY

The following presents a simplified summary of the disclosure in order to provide a basic understanding to those of skill in the art. This summary is not an extensive overview of the disclosure and is not intended to identify key/critical elements of embodiments of the invention or to delineate the scope of the invention. The sole purpose of this summary is to present some concepts disclosed herein in a simplified form as a prelude to the more detailed description that is presented later.

According to one or more embodiments described and claimed herein, an envelope tracking calibration procedure calculates both a supply voltage to apply to a power amplifier for a modulated signal envelope to achieve ISO-gain, and a timing delay adjustment to time-align the applied supply voltage and the modulated signal to minimize distortion due to time delay error. An ISO-gain surface is calculated, as a function of the envelope of a modulated signal and the power amplifier supply voltage, for each of a plurality of desired gain values. As the envelope is swept through a predetermined range of values, demodulated outputs at predetermined points are sampled, and a set of non-linear functions relating the supply voltage to the envelope, which achieve the desired gain at the sampled points, are derived, using surface interpolation between the predetermined gain surface points. Data defining the functions are stored for use during transmitter operation. Distortion components in the transmitter output are detected, and are separated into even components representing time delay error distortion, and odd components representing transmitter saturation distortion. A timing delay value is calculated that minimizes the time delay error distortion.

One embodiment relates to a method of estimating a gain of a transmitter in a wireless communication terminal. The transmitter includes a modulator receiving an input signal, a power amplifier receiving a variable supply voltage and operative to amplify the modulator output, and a demodulator operative to demodulate the amplifier output. A time repetitive signal $u_{mod}$, for which the absolute value $|u_{mod}(t)|$ includes all relevant values within a predetermined range and is a slowly varying signal, is applied as an input signal to the modulator. A variable supply voltage $V_{PA}$ that is a function of $|u_{mod}(t)|$ is applied to the power amplifier. An integer number of samples of the demodulator output $U_{out\_demod}$ is sampled. The demodulator output $U_{out\_demod}$ is time and phase aligned with the input signal $u_{mod}$ to generate an aligned output $U'_{out\_demod}$. The gain G is estimated as a function of $|u_{mod}(t)|$, and $U'_{out\_demod}$.

Another embodiment relates to a transmitter operative in a wireless communication terminal. The transmitter includes a modulator operative to receive an input signal, and a power amplifier receiving a variable supply voltage and operative to amplify the modulator output. The transmitter further includes a demodulator operative to demodulate the amplifier output and a baseband processor receiving the demodulator output. An input signal to the modulator is a time repetitive signal $u_{mod}$ having a repetition period T and for which the absolute value $|u_{mod}(t)|$ includes all relevant values within a predetermined range and is a slowly varying signal. A variable supply voltage $V_{PA}$ applied to the power amplifier is a function of $|u_{mod}(t)|$. An integer number of samples of the demodulator output $U_{out\_demod}$ are sampled. The baseband processor is operative to time and phase aligning the demodulator output $U_{out\_demod}$ with the input signal $u_{mod}$ to generate an aligned output $U'_{out\_demod}$; and to estimate the gain G as a function of $|u_{mod}(t)|$ and $U'_{out\_demod}$.

BRIEF DESCRIPTION OF THE DRAWINGS

The present invention will now be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. Like numbers refer to like elements throughout.

DETAILED DESCRIPTION

It should be understood at the outset that although illustrative implementations of one or more embodiments of the present disclosure are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

Figure 2:
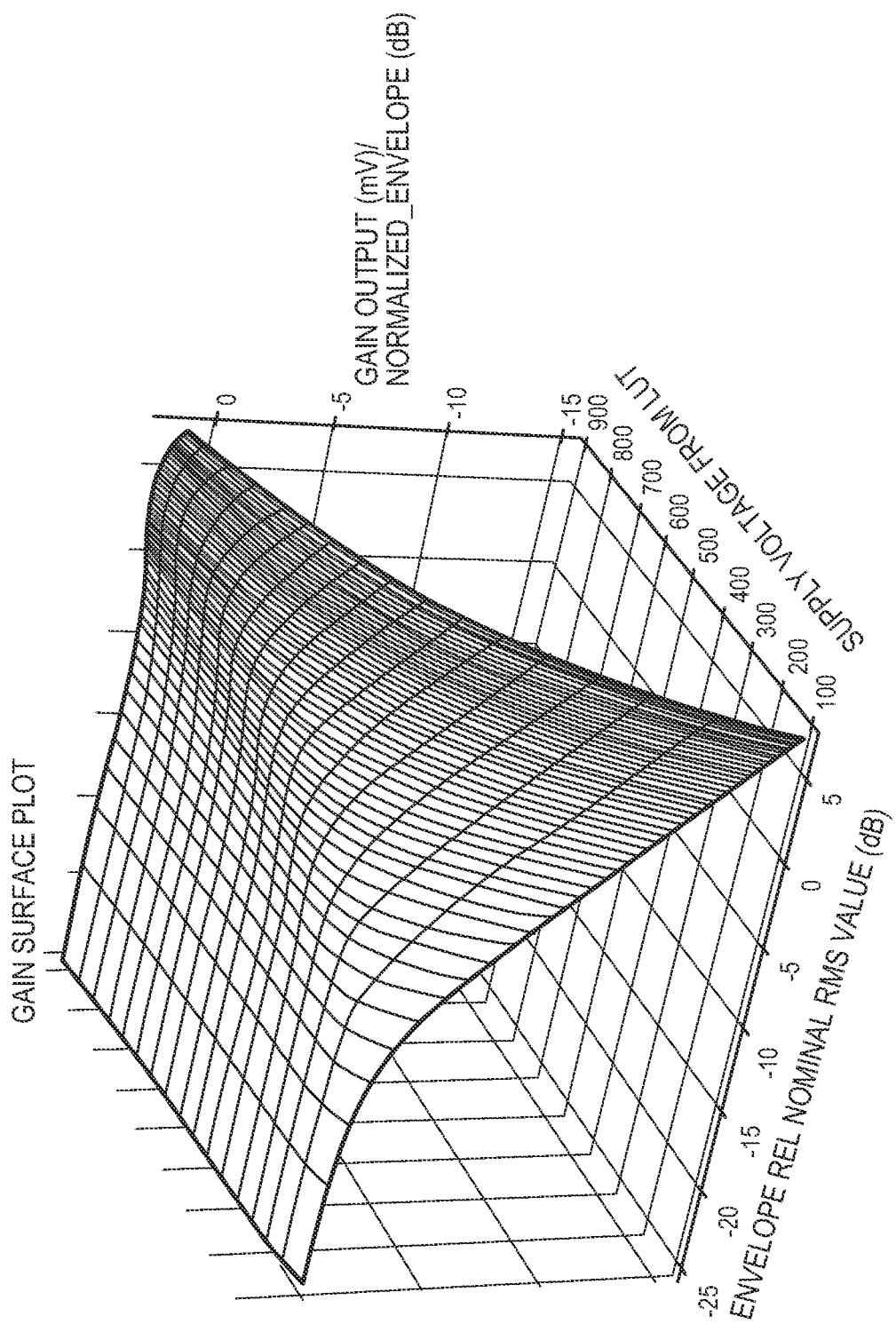
FIG. 2 is a graph of a three-dimensional gain surface, as a function of a modulated signal envelope and the supply power applied to a power amplifier.
Figure 3:
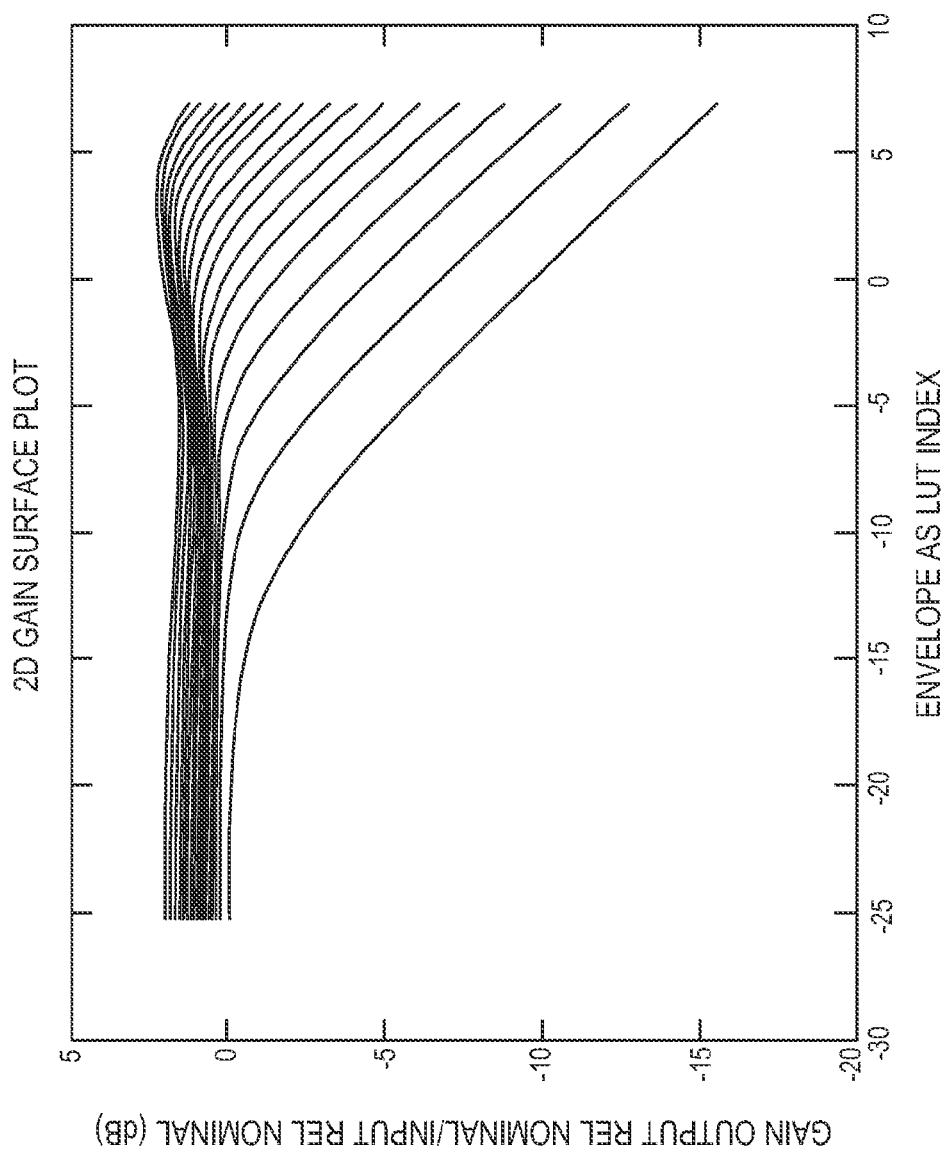
FIG. 3 is a graph of gain values as a function of signal envelope, for a constant power amplifier supply voltage.

As described above, envelope tracking is a method of dynamically varying the supply power applied to a Power Amplifier (PA) 14 in a transmitter, in order to maximize the efficiency of the PA 14 operation. Ideally, the PA 14 should apply a selected, static gain—referred to herein as ISO-gain—at all times. This reduces distortion in the PA 14 and minimizes current consumption. However, the gain of the PA 14 is difficult to control. In general, the PA 14 gain varies in a non-linear manner with both the applied RF signal amplitude and the applied supply power level. FIG. 2 depicts a graph of the PA 14 gain surface as a function of these two variables. The surface is 3-dimensional, and non-linear. Accordingly, it cannot be rapidly computed with accuracy, but must be calibrated by measuring the actual gain using test signals applied at different magnitudes and with different supply voltages applied to the PA 14. FIG. 3 depicts a set of lines representing the gain for various signal amplitude envelopes, while holding the supply voltage at a constant value.

In some embodiments, the required supply voltage the Power Management Unit (PMU) 18 should apply to the PA 14 for a given RF signal amplitude envelope is determined by parameters retrieved from an appropriate pre-distortion Look-Up Table (LUT) 48, indexed by the current envelope value. This LUT 48 may be populated in a calibration procedure, which utilizes test signals generated by the test signal generator 24 on the RF IC. In one embodiment, nine tables are tuned for each frequency band of interest (three frequencies per band, and three gains per frequency). The gain may be determined by calculating IQ values from the receiver circuit 56, rather than using dedicated hardware. Calibration calculations are performed in the digital broadband processing circuit 60.

However, ascertaining the proper supply voltage that the PMU 18 should apply to the PA 14 for a given RF signal envelope value (to achieve the desired constant gain) is only half of the solution. In addition, the determined supply voltage must be applied to the PA 14 at precisely the right time. In general, the RF signal processing path 28 and the envelope tracking processing path 30 have different delays. Accordingly, the two paths 28, 30 must be time-synchronized, to within less than 1 nsec. in one embodiment, such as by adjusting one or both of the delay control blocks 34, 50. To determine the proper timing, timing errors may be determined in a calibration procedure. The test signal generator 24 on the RF IC is also used as a signal source in the timing delay calibration. IQ values from the receiver circuit 56 are determined, and calibration calculations are performed in the digital broadband processing circuit 60.

In a calibration procedure, two things must thus be determined: values to populate the pre-distortion LUT 48 to achieve ISO-gain, and the timing error.

Gain Calculation

According to embodiments described herein, the RF circuit 10 is calibrated to generate and store a number of LUTs, which provide parameters during operation for the RF circuit 10 to operate at a constant gain.

In one embodiment, one lookup table relates supply voltage as a nonlinear function of the baseband envelop. One table is relevant for a gain corresponding to a selected compression point at a given radio frequency. A number of tables are needed based on different frequencies and compression points. As one representative example, to support eight generic frequency bands, three sub-bands per band, and three gains per frequency, a total 72 tables are required. A conservative estimate of the calibration time for a typical case with eight bands is 400 ms.

As mentioned above, in general the gain varies with both signal envelope and supply voltage. To minimize the tests, test signals are used in which both the signal envelope and the supply voltage are changed in one measurement. Rx BB 58 IQ values are then sampled and analyzed. This provides greater flexibility than the use of dedicated hardware blocks to calculate gain.

In one representative example, the Rx 56 includes a 10-bit analog to digital converter operating at 78 MHz. The sample rate in the Rx 56 is set to 78 MHz.

Figure 4:
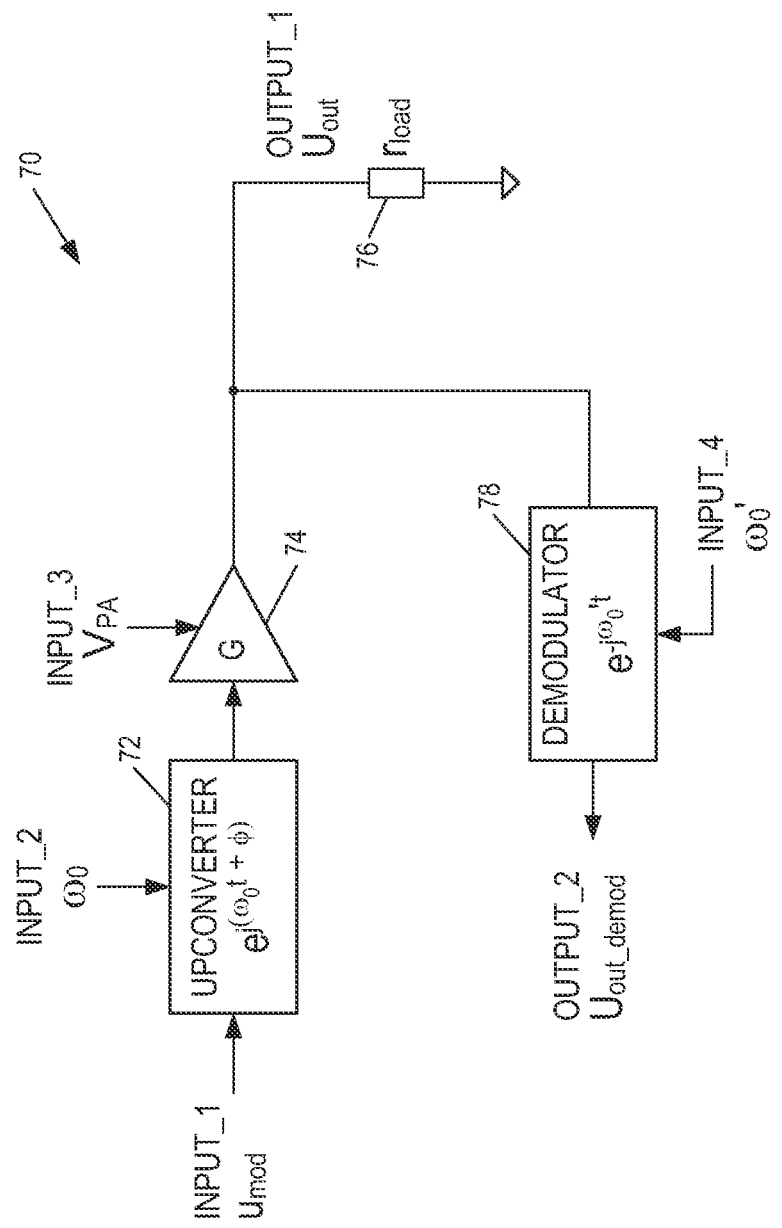
FIG. 4 is a functional block diagram of an RF transmitter.

FIG. 4 depicts a simplified model of an RF transmitter 70, comprising an upconverter 72, PA 74, load 76, and demodulator 78, and where:

Input_1=$u_{mod}$ is the time varying modulation information to be transmitted;
Input_2=$\omega_0$ is the carrier frequency of the transmitter;
Input_3=$V_{PA}$ is the supply voltage to the PA 74;
Input_4=$\omega_0'$ is the carrier frequency used in the demodulator 78 (ideally, $\omega_0'=\omega_0$);
$\phi$ is the random phase rotation in the complete transmitter;
G is the gain of the PA 74;
Output_1=$U_{out}$ is the output signal of the transmitter over the load $r_{load}$ 76; and
Output_2=$U_{out\_demod}$ is the demodulated output signal (with carrier frequency removed).

The PA 74 gain G is a function of $u_{mod}$ and $V_{PA}$: G=$f(u_{mod}, V_{PA})$. The output signal $U_{out}$ can mathematically be described as $U_{out}=u_{mod}(t)\cdot e^{j(\omega_0 t+\phi)}\cdot G$, where t is time. The demodulated output signal $U_{out\_demod}$ can mathematically be described as $U_{out\_demod}=u_{mod}(t)\cdot e^{j((\omega_0-\omega_0)t+\phi)}\cdot G$.

According to one embodiment, the unknown and potentially non-linear gain G of the PA 74 is identified as follows. Input_1, $u_{mod}$ is a time repetitive signal, $u_{mod}(t+T)=u_{mod}(t)$ where T is the period of repetition. The absolute value of Input_1, $u_{mod}(t)$ includes all relevant values to be analyzed, and it is a slowly varying signal, to avoid distortion from error in time delay. In one embodiment, f=19.5/512 MHz≈38 kHz, yielding a cycle time of ≈26 usec.

At every time t, the Output_2, $U_{out\_demod}$ has a value that is a good approximation of the corresponding demodulated signal using a time invariant $u_{mod}$. Input_3, $V_{PA}$ has known value as a function of the absolute value of Input_1, $|u_{mod}(t)|$.

Output_2, $U_{out\_demod}$ is sampled with a sufficiently high frequency to fully capture the time varying signal. In one embodiment, to have approximately the same number of measurements when ramping envelops from zero to full signal as the number of points in the lookup table, 64 samples are selected, yielding 256 samples per cycle, for a sample frequency of 19.5/2 MHz., or ≈9.75 MHz. An integer number of samples is captured each repetition period T. To reduce the impact from measurement noise, several consecutive repetition periods may be sampled.

When the same local oscillator is used for both the upconverter 72 and demodulator 78, no frequency correction is necessary (however, time and phase must still be aligned, as discussed below). In general, however, different equipment could be used, each with a separate LO. In this case, the carrier frequency of the demodulator 78 will not be identical to the carrier frequency of the upconverter 72, and the frequency difference must be identified. The samples are then rotated to compensate for the frequency difference. To reduce the complexity of the analysis, all samples may be averaged into one or a few repetitive periods. The sampled $U_{out\_demod}$ signal is not time synchronized with $u_{mod}$; accordingly, these signals are time and phase aligned. $U_{out\_demod}$ denotes the sampled sequence after frequency correction, averaging, and time and phase alignment. The phase aligning will remove the unknown phase rotation $\phi$ in the upconverter 72. Finally, the unknown gain G can be estimated as a function of the absolute value of Input_1, $|u_{mod}|$ as $$G(|u_{mod}(t)|) = \frac{U'_{out\_demod}}{u_{mod}}.$$

In one embodiment, the frequency difference $\omega_0-\omega_0'$ is identified. First, the frequency difference is estimated by averaging the following calculation over a number of sample pairs: $U_{out\_demod}(t) \cdot U_{out\_demod}(t+nT)^*$ where $U_{out\_demod}^*$ denotes the conjugate of $U_{out\_demod}$ and nT denotes a time corresponding to n repetitive cycles. The frequency distance is then calculated as the phase of the complex value given by the averaging, divided by the time nT. Samples are rotated by the determined frequency difference to remove the unwanted rotation of $U_{out\_demod}$.

In one embodiment, a complete gain surface is estimated as follows. The above-described method of gain estimation is repeated k times, where k is an integer. In each repetition i where i=0 . . . k−1, the supply voltage $V_{PA}(i)$ has a (different) known value as a function of the absolute value of Input_1, $|u_{mod}(t)|$. The function is different for each repetition. The functions are selected to cover the relevant values of $V_{PA}=f(|u_{mod}|)$. The gain estimation is calculated as $$|G(|u_{mod}|)| = \frac{|U'_{out\_demod}|}{|u_{mod}|}.$$

Note that only absolute values can be calculated since the phase relationship between repetitions is unknown. These repeated measurements create a three-dimensional gain surface, where the absolute value of gain amplitude as a function of the absolute values of Input_1 and Input_3, $|G|=f(|u_{mod}|,V_{PA})$, is represented as sample points over the surface.

In one embodiment, the set of functions selected to determine $V_{PA}$ is determined by considering Input_3 as a function of Input_1 for different repetitions, $V_{PA}(i)=f_i(|u_{mod}|)$. Functions $f_i$ are selected in such a way that every function has at least one crossing point with at least one other function, in such a way that all functions are connected through these crossing points. As used herein, the term "crossing point" means a point at which different functions f yield the same output $V_{PA}$ for the same input value $|u_{mod}|$. Measured complex values $U''_{out\_demod}$ at crossing points are used to align the unknown phase rotation $\phi$ having different values in each measurement. $U''_{out\_demod}$ denotes Output_2 after frequency correction, averaging, and time and phase alignment, including the phase alignment between repetitions using different functions f. The complex gain surface is then calculated as $$G(|u_{mod}|, V_{PA}) = \frac{U'_{out\_demod}(|u_{mod}|, V_{PA})}{|u_{mod}|}.$$

In one embodiment, Input_1 is selected as $$u_{mod}(t) = A \cdot \cos\left(\frac{2\pi}{T} \cdot t\right),$$

where A is the amplitude of the signal and T is the period of repetition.

In one embodiment, the calculated gain is scaled to the nominal gain of the transmitter. The nominal gain is calculated as the root of the average nominal output power over one modulation cycle, divided by the root of the average modulation power over one modulation cycle. G' denotes the calculated gain after scaling, $$G' = \frac{G}{G_{nominal}}.$$

With the information collected about the transmitter 70, the appropriate $V_{PA}$ for a given envelope $|u_{mod}|$ can be applied, to achieve the desired gain. In general, the gain is a complex value.

Calibrating the Transmitter for Gain

Figure 5:
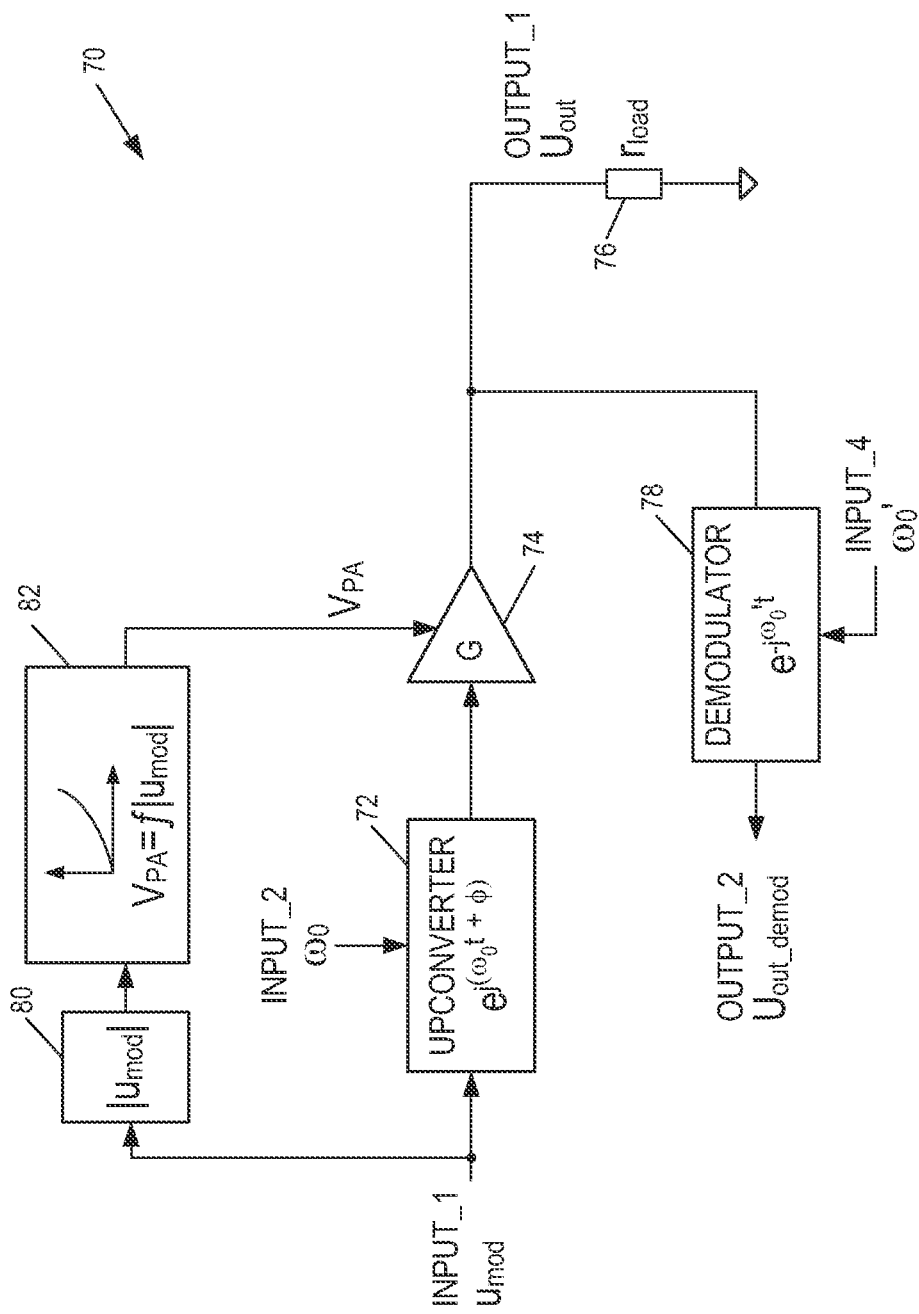
FIG. 5 is a functional block diagram of the transmitter of FIG. 4 with envelope extraction and a variable power supply.

FIG. 5 depicts the RF transmitter 70 model, with an envelope detection module 80 and a variable power supply 82. The power supply 82 generates a variable $V_{PA}$ (Input_3 in the model of FIG. 4), as a function of $|u_{mod}|$. That is, $V_{PA}=f(|u_{mod}|)$. A variety of different functions f may be utilized. The desired gain of the transmitter is denoted $|G_0|$.

In one embodiment, as described above, the gain may be estimated an integer k times, using a different function $f_i$ for each iteration i=0 . . . k−1. In each calculation, the gain is calculated as $$|G(|u_{mod}|)| = \frac{|U'_{out\_demod}|}{|u_{mod}|},$$

and repeated measurements create a three-dimensional gain surface represented by sample points over the surface. In greater detail, in one embodiment the value of Output_2, the demodulated output signal $U_{out\_demod}$, is sampled an integer m number of times for each modulation period, and the $U_{out\_demod}$ measurement is repeated an integer k number of times, as described above. The gain estimation at each sample point is then calculated as $$|G_{i,j}| = \frac{|U'_{out\_demod-i,j}|}{|u_{mod-j}|}$$

where i=0 . . . k−1 and j=0 . . . m−1. The total number of gain values calculated over the gain surface is then the integer value k*m. The modulation signal $u_{mod}$ and known functions for $V_{PA}(i)$ are selected to cover the uncertainty regions of transmitter gain. The desired gain $|G_0|$ may be found on the gain surface defined by gain estimations $|G_{i,j}|$. A function f where $V_{PA}=f(|u_{mod}|)$ giving a transmitter gain of $|G_0|$ is calculated using gain estimation samples $|G_{i,j}|$.

In one embodiment, the function f is calculated using surface interpolation between gain estimation samples $|G_{i,j}|$. That is, surface interpolation is performed to identify the function f in $V_{PA}=f(|u_{mod}|)$ yielding a transmitter gain of $|G_0|$ for all relevant modulation signals $u_{mod}$. This approach minimizes the required calibration measurements. Alternatively, a gain surface may be defined comprising significantly more samples, and the closest sample chosen, without interpolation. However, such an approach required significantly longer calibration, and a much greater volume of data to be maintained.

The surface interpolation may be split up into two one-dimensional interpolations. First, for each modulation value j there are k gain estimations for different supply voltages, $$|G_{i,j}| = \frac{|U'_{out\_demod-i,j}|}{|u_{mod-j}|}$$

where i=0 . . . k−1. For each modulation value the transmitter gain is a function of the supply voltage $V_{PA}$. $V'_{PA}$ denotes the supply voltage yielding the desired gain $|G_0|$ at each modulation value. One-dimensional interpolation may be used to calculate $V'_{PA}$ from the gain estimations. Second, m values of $V'_{PA}(j)$ have now been calculated, where j= 0 . . . m−1, that yield the desired transmitter gain $|G_0|$ for each modulation signal $u_{mod-j}$. $V|_{PA}(u_{mod})$ denotes the supply voltage yielding the desired gain $|G_0|$ for any arbitrarily selected modulation signal $u_{mod}$. One-dimensional interpolation is used to calculate $V''_{PA}(u_{mod})$ from $V'_{PA}$ at sampled points of $u_{mod}$.

In one embodiment, the one-dimensional interpolation is performed locally by first identifying the sampling point with the closest distance to the search point that is, $|G_0|$ in the first interpolation and $u_{mod}$ in the second interpolation. An integer number of samples on each side of the closest point may be used as input to the interpolation. Statistical behavior of the gain surface is used to determine the integer value and interpolation type, such as linear, cubic spline, or the like.

In one embodiment, the function f in $V_{PA}=f(|u_{mod}|)$ yielding a transmitter gain of $|G_0|$ is calculated for a limited number of $|u_{mod}|$ points and stored in a Look Up Table (LUT) to be accessed when using the transmitter.

Time Delay Analysis—Small Signal Model

Figure 6:
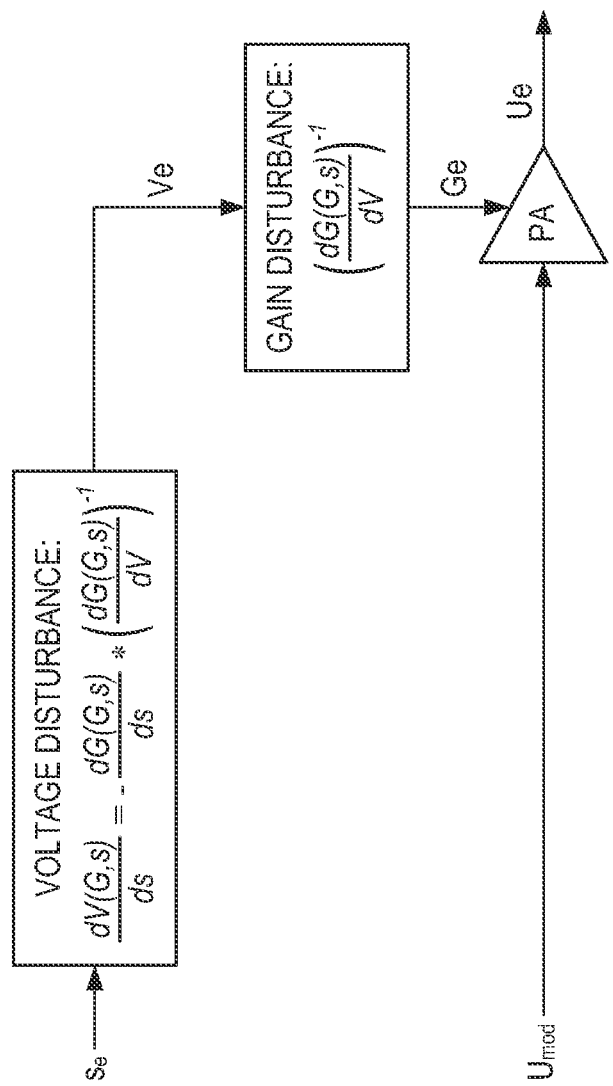
FIG. 6 is a block diagram of a mathematical model of small signal error propagation in a transmitter.

FIG. 6 depicts one model of the distortion in the transmitter output due to a time error between the supply voltage $V_{PA}$ applied to the power amplifier and the input signal at the amplifier input. In this analysis,
$u_{mod}$=modulated input signal (complex I, Q values)
$s=|u_{mod}|$ is the envelope of the input signal
$V_{PA}$=supply voltage applied to the PA
G=power amplifier gain
$t_e$=timing error
$s_e$=error in signal envelope caused by $t_e$
$V_e$=error signal in supply voltage caused by $t_e$
$G_e$=error in gain caused by $t_e$
$u_e$=output error signal caused by $t_e$ A gain surface as a function of signal envelope and supply voltage, $G=f(s,V_{PA})$ has been defined for each desired gain G. For every point (G, s, $V_{PA}$) on the ISO-gain surface along a constant gain curve, the following small signal behavior is true:

$$\frac{dG(G,s)}{ds} = -\frac{dG(G,s)}{dV_{PA}} \cdot \frac{dV_{PA}(G,s)}{ds}.$$

That is, a small perturbation along the s axis gain change must be followed with perturbation along the V axis causing the same gain change with opposite sign, to maintain a constant gain. Thus, the ISO-gain pre-distortion curve can be defined by the small signal relationship:

$$\frac{dV_{PA}(G,s)}{ds} = -\frac{dG(G,s)}{ds} \cdot \left(\frac{dG(G,s)}{dV_{PA}}\right)^{-1}.$$

Furthermore, a time error between the signal input and supply voltage at the power amplifier can be modeled as an added small signal error on the envelope signal in the pre-distortion path: $s_e(t)=s(t+t_e)-s(t)$. This signal can be viewed as a small added perturbation in the envelope path prior to the pre-distortion non-linearity function.

The output error signal $u_e$ is $$u_e = u_{mod}(t) \cdot G_e(t) = -\frac{dG(G,s(t))}{ds} \cdot s_e(t) \cdot u_{mod}(t).$$

The quantity $$\frac{dG(G,s(t))}{ds}$$

is known from the ISO-gain calibration. Accordingly, the error signal can be calculated.

Time Delay Analysis—Transmitter Model

Figure 7:
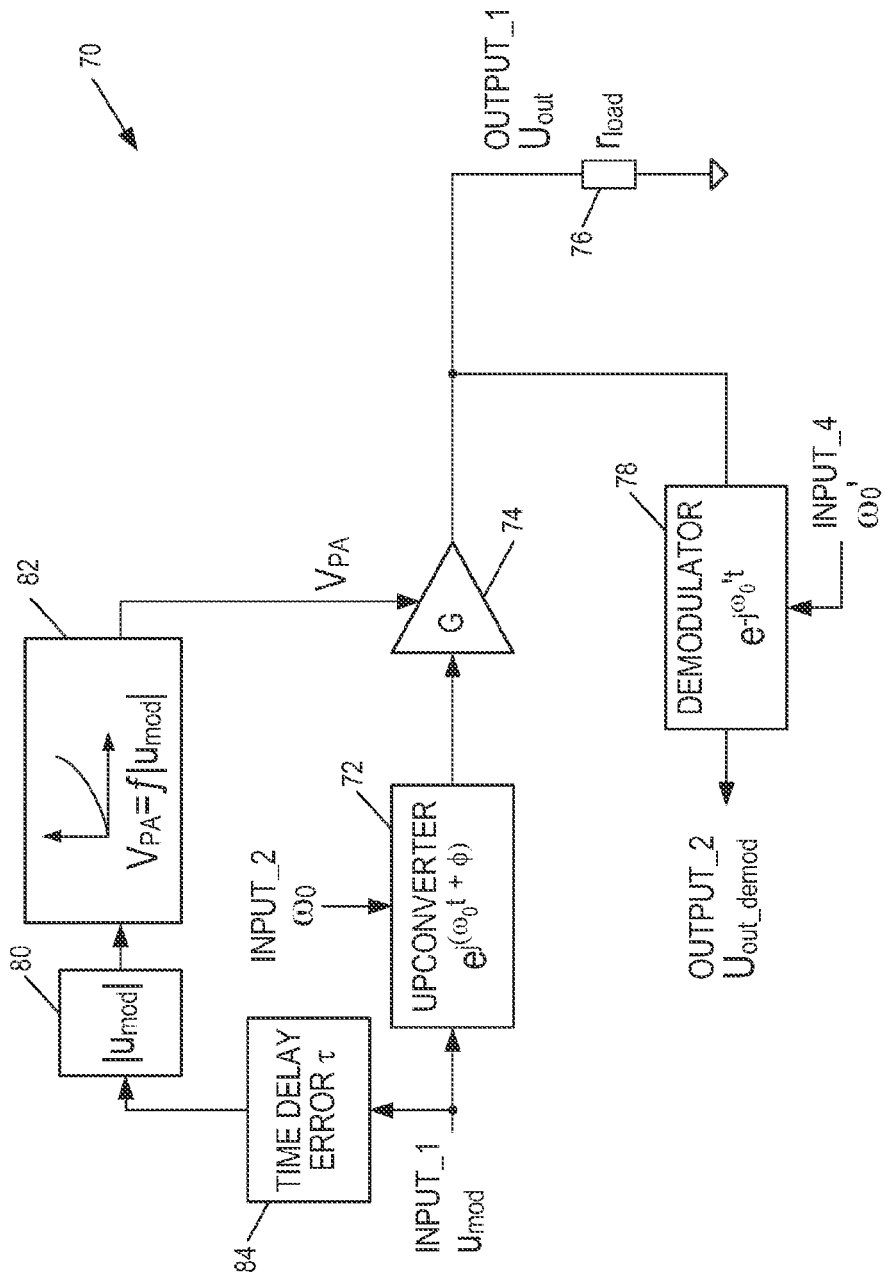
FIG. 7 is a functional block diagram of the transmitter of FIG. 5 with a time delay error.

Turning now to FIG. 7, there are two distinct sources of distortion in the envelope tracking transmitter 70 modeled in FIGS. 4 and 5. In both cases, $V_{PA}$ is determined as a function of $|u_{mod}|$, $V_{PA}=f(|u_{mod}|)$. Ideally, the function f is selected to control gain $G=G_0 e^{j\phi}$ where $\phi$ is a static phase rotation, yielding an output $U_{out}$ without any distortion. The first source of distortion arises if the function f is unable to control gain adequately. In this case, there will be a distortion component in the demodulated output $U_{out\_demod}$. The demodulated distortion is denoted $u_{distortion}$. Simplifying the constant phase rotation to zero and the frequency error in the downconverter $(\omega_0-\omega_0')$ to zero yields $U_{out\_demo}=G_0 u_{mod}+u_{distortion}(|u_{mod}|)$ A second source of distortion arises even if the function f performs ideally, but there is an unwanted delay, such that $V_{PA}=f(|u_{mod}(t+\tau)|)$ where t is time and T is a time delay error. FIG. 7 depicts the insertion of a time delay error $\tau$ at block 84. It can be shown that for small time delay errors, $U_{out\_demod}=G_0 \cdot u_{mod}+u_{distortion}$ where $$u_{distortion} = -\tau\left(u_{mod} \cdot \frac{d|u_{mod}|}{dt} \cdot \frac{dG(|u_{mod}|)}{d|u_{mod}|}\right).$$

Note that the distortion is proportional to the time delay error.

In reality, both of these sources of distortion exist, and must be analyzed. Distortion due to the function f not controlling gain adequately is referred to as $u_{saturation\_distortion}$, and distortion due to time delay error is denoted $u_{delay\_distortion}$.

In one embodiment, Input_1 is a time repetitive signal, $u_{mod}(t+T)=u_{mod}(t)$ where t is time and T is the period of repetition. The absolute value of Input_1, $|u_{mod}(t)|$, includes all relevant values to be analyzed. The speed of variation of $|u_{mod}(t)|$ is selected to be high enough to identify time delay errors, but low enough to limit the signal to within the bandwidth of transmitter, and also allow time distortion components to pass within the bandwidth of the demodulator. Input_3, $V_{PA}$, has known value as a function of absolute value of Input_1, $|u_{mod}(t)|$. The function f is selected to set the Gain $|G| \approx G_0$ for all relevant levels of time invariant $|u_{mod}|$.

Output_2, $U_{out\_demod}$, is sampled with high enough frequency to fully capture the time varying signal. An integer number of samples is captured each repetition period T. To reduce the impact from measurement noise, several consecutive repetition periods can be sampled. If the carrier frequency of the demodulator 78 is not identical to the carrier frequency of the upconverter 72 then the frequency difference $(\omega_0 - \omega_0')$ must be identified, and the samples rotated to compensate for the frequency difference. To reduce the complexity of analysis, all samples may be averaged into one or a few repetitive periods. The sampled $U_{out\_demod}$ signal is not time synchronized with $u_{mod}$; accordingly, these signals are time and phase aligned. $U'_{out\_demod}$ denotes the sampled sequence after frequency correction, averaging, and time and phase alignment. The phase aligning will remove the unknown phase rotation $\phi$ in the upconverter 72. $U'_{out\_demod}$ is used to calculate distortion, and to separate the distortion components $u_{saturation\_distortion}$, and $u_{delay\_distortion}$.

$U'_{out\_demod}$ is a periodic signal with period T. The signal is decomposed into odd and even components $u_{odd}$ and $u_{even}$, respectively. $U'_{out\_demod}(t) = u_{odd}(t) + u_{even}(t)$ where $u_{odd}(t) = -u_{odd}(-t)$ and $u_{even}(t) = u_{even}(-t)$. If $u_{mod}(t)$ is selected as a pure even function, then $u_{saturation\_distortion}$ is the even part of $U'_{out\_demod} - G_0 * U_{mod}$ and $u_{delay\_distortion}$ is the odd part of $U'_{out\_demod} - G_0 * U_{mod}$.

The time periodic time delay distortion $u_{delay\_distortion}$ is used to estimate the time delay error. The time delay error is calculated from $$u_{delay\_distortion} = -\tau \left( u_{mod} \cdot \frac{d|u_{mod}|}{dt} \cdot \frac{dG(|u_{mod}|)}{d|u_{mod}|} \right).$$

The part within parenthesis can be pre-calculated prior to sampling Output_2, $U_{out\_demod}$. The function is periodic and shows the signal behavior of the distortion as a function of time over the full period.

$$\frac{d|u_{mod}(t)|}{dt}$$

can be pre-calculated as a function of Input_1, $u_{mod}(t)$.

$$\frac{dG(|u_{mod}|, V_{PA})}{d|u_{mod}|}$$

can be pre-calculated using the gain surface estimated as described above and the selected $V_{PA} = f(|u_{mod}|)$ where the function f yielding a gain of $|G_0|$ is calculated using surface interpolation between gain estimation samples $|G_{i,j}|$, as described above. Either time domain distortion $u_{delay\_distortion}$ or distortion transformed to the frequency domain can be used to estimate the time delay error $\tau$.

Calibrating the Transmitter for Time Delay

Figure 8:
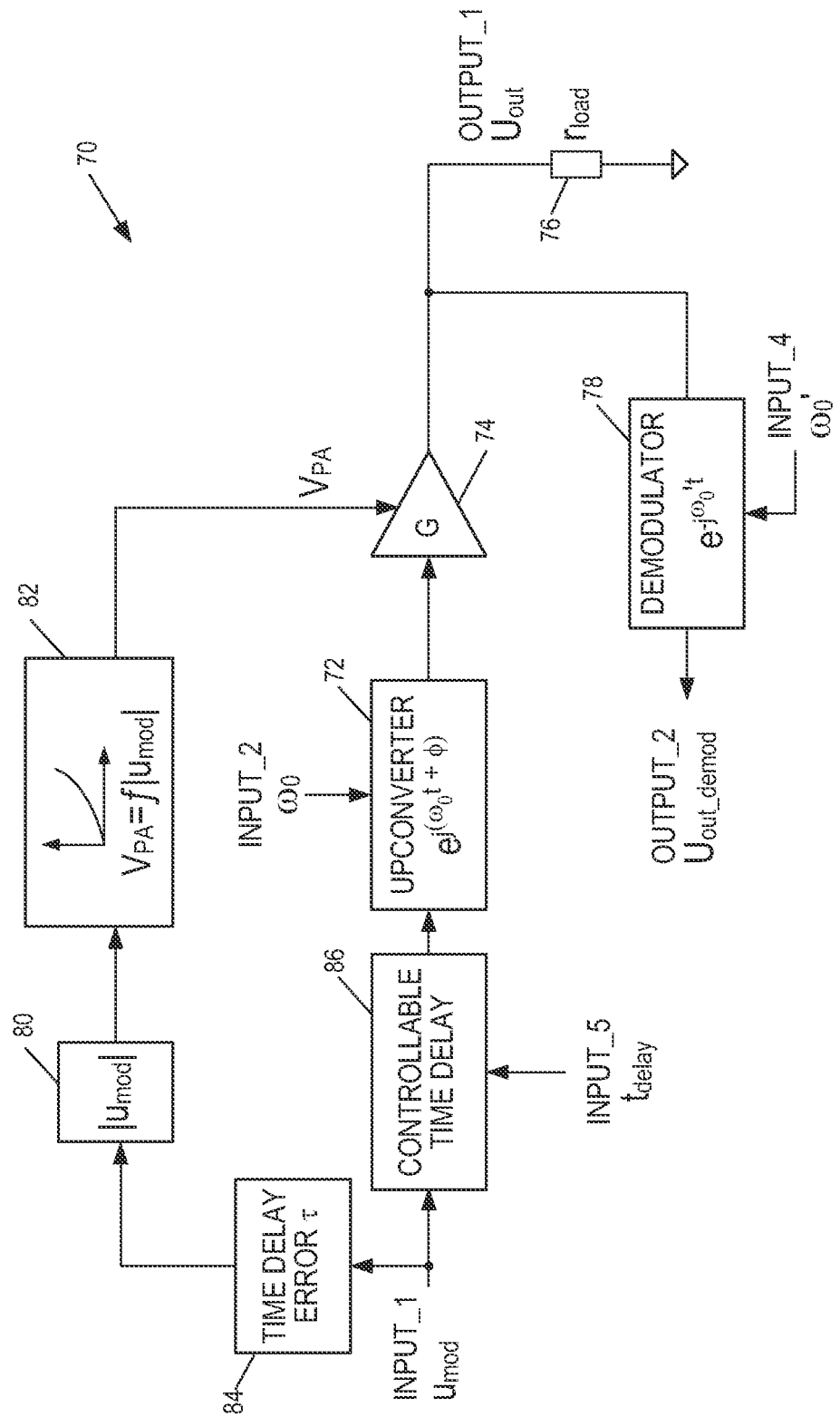
FIG. 8 is a functional block diagram of the transmitter of FIG. 6 with a controllable time delay insertion.

FIG. 8 includes a controllable time delay block 86 receiving Input_5, $t_{delay}$. This input controls the time delay in the signal path 28, to align $V_{PA}$ at the PA 74 with the signal and minimize the time delay distortion in Output_1, $U_{out}$. In general, $t_{delay}$ can have both positive and negative values.

The time delay error $\tau$ is estimated as described above. The estimated time delay error $\tau$ is used to update Input_5, $t_{delay}$ minimize the time delay error. The time delay error $\tau$ estimate is iteratively repeated, and the time delay $t_{delay}$ is updated until the measured absolute value of time delay error $|\tau|$ is sufficiently small (or disappears). The final time delay value $t_{delay}$ is then stored, for use during normal operation of the transmitter 70.

In one embodiment, with an integer number M of repetitions, the time delay is set to different values covering the uncertainty region of time delay error. For each repetition, the time delay error $\tau$ is calculated as described above. The resulting set of time delay errors is then used to estimate a function f where time delay error $\tau = f(t_{delay})$. This function is used to calculate the time delay $t_{delay}$ minimizing the time delay error. The resulting time delay value $t_{delay}$ is stored for use during normal operation of the transmitter 70. In one embodiment, the function f is estimated using suitable polynomial regression using a least square method.

In one embodiment, with an integer number M of repetitions, the time delay is set to different values covering the uncertainty region of time delay error. For each repetition, the time delay error $\tau$ is calculated as described above. The resulting set of time delay errors is then used to estimate a function f where time delay distortion $u_{delay\_distortion} = f(t_{delay})$. This function is used to calculate the time delay $t_{delay}$ minimizing the time delay distortion. The resulting time delay value $t_{delay}$ is stored for use during normal operation of the transmitter 70. In one embodiment, the function f is estimated using suitable polynomial regression using a least square method.

Implementation

Figure 9:
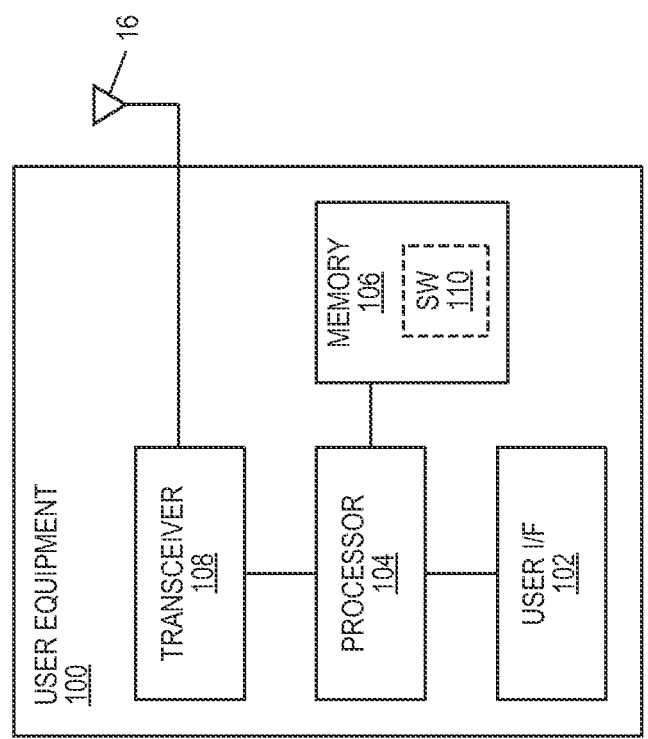
FIG. 9 is a functional block diagram of a UE.

FIG. 9 depicts a wireless communication network terminal, also known as User Equipment (UE) 100 operative in embodiments of the present invention. As those of skill in the art are aware, a UE 100 is a device, which may be battery-powered and hence mobile, operative within a wireless communication network. The UE 100 includes a user interface 102 (display, touchscreen, keyboard or keypad, microphone, speaker, and the like); a processor 104; memory 106; and a radio circuitry, such as one or more transceivers 108, antennas 16, and the like, to effect wireless communication across an air interface to one or more base stations (also known as eNode B). The UE 100 may additionally include features such as a camera, removable memory interface, short-range communication interface (Wi-Fi, Bluetooth, and the like), wired interface (USB), and the like (not shown in FIG. 9). According to embodiments of the present invention, the memory 106 is operative to store, and the processor 104 operative to execute, software 110 which when executed is operative to cause the UE 100 to perform methods and functions described herein.

The processor 104 may comprise any sequential state machine operative to execute machine instructions stored as machine-readable computer programs in the memory, such as one or more hardware-implemented state machines (e.g., in discrete logic, FPGA, ASIC, etc.); programmable logic together with appropriate firmware; one or more stored-program, general-purpose processors, such as a microprocessor or Digital Signal Processor (DSP), together with appropriate software; or any combination of the above.

The memory 106 may comprise any non-transitory, machine-readable media known in the art or that may be developed, including but not limited to magnetic media (e.g., floppy disc, hard disc drive, etc.), optical media (e.g., CD-ROM, DVD-ROM, etc.), solid state media (e.g., SRAM, DRAM, DDRAM, ROM, PROM, EPROM, Flash memory, solid state disc, etc.), or the like.

The radio circuitry may comprise one or more transceivers 108 used to communicate with one or more other transceivers via a Radio Access Network according to one or more communication protocols known in the art or that may be developed, such as IEEE 802.xx, CDMA, WCDMA, GSM, LTE, UTRAN, WiMax, or the like. The transceiver 108 implements transmitter 10, 70 and receiver functionality appropriate to the Radio Access Network links (e.g., frequency allocations and the like). The transmitter and receiver functions may share circuit components and/or software, or alternatively may be implemented separately. In particular, the transceiver 108 includes an envelope tracking transmitter 10, 70, together with a transmitter measurement receiver and baseband circuit 20 as described herein with respect to FIGS. 1, 4-5, and 7-8.

Figure 1:
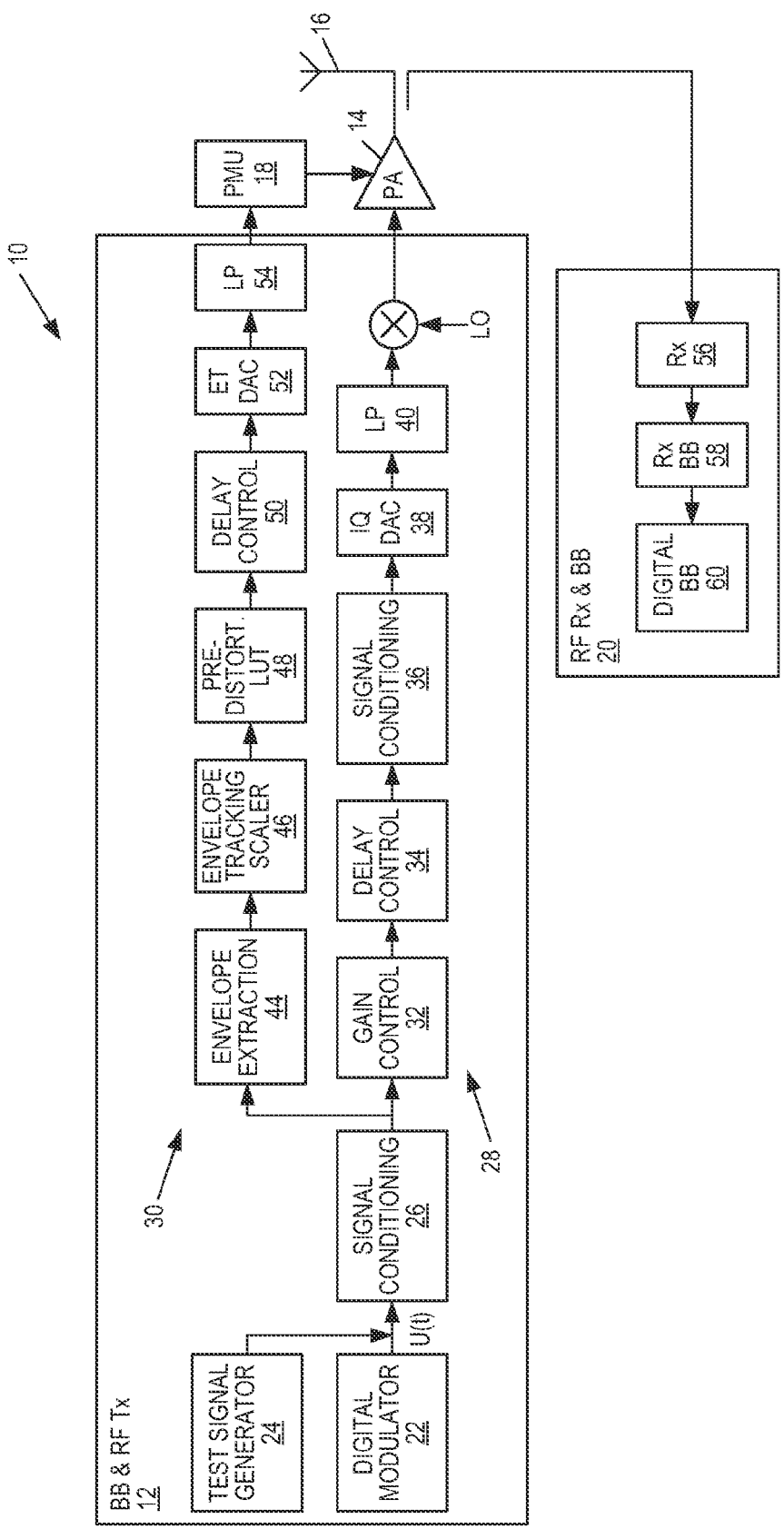
FIG. 1 is a functional block diagram of portions of an RF transceiver.

In the transmitter 70 models of FIGS. 4-5 and 7-8, those of skill in the art will appreciate that the functional blocks 72, 78, 80, 82, 84, 86, as well as the baseband processing circuits 58, 60 of FIG. 1, may be implemented as hardware circuits, as programmable logic circuits together with appropriate firmware, or as one or more stored-program processing circuits, such as a microprocessor or Digital Signal Processor, together with appropriate software, or in any combination thereof. In particular, the functional blocks 72, 78, 80, 82, 84, 86 may be implemented in processing circuit 104, and/or other computational circuitry. In this case, appropriate software 106 implementing the functionality 72, 78, 80, 82, 84, 86 may be stored in memory 106, or other memory on the UE 100.

Advantages

Embodiments of the present invention present numerous advantages over the prior art. Envelope tracking calibrations are typically performed on each RF IC in production, and the resulting calibration data, which is unique to each device, is associated with, or stored in, the device. Since any operations, such as calibration, that slow production are to be avoided, the techniques and methods of embodiments of the present invention which are very fast, achieve high accuracy, and require the storage of only small LUTs, as compared to prior art approaches—are particularly advantageous. In addition to high speed and accuracy, the calibration approach described and claimed herein also produces a measurement of normal distortion.

Envelope tracking allows for efficient operation of a transmitter 70 even in the case of a non-linear PA 74. By providing a quick, efficient, high-performance calibration to achieve constant gain in the face of highly non-linear envelope and supply voltage relationships, a lower quality (that is, more non-linear), and hence less expensive, PA 74 may be utilized while maintaining high overall transmitter 70 efficiency and performance.

Finally, those of skill in the art will note that, although the methods herein are described as calibration methods, those of skill in the art will readily recognize that they can be developed into a methods of dynamically tuning transmitters during normal operation, to reduce distortion and/or maximize power performance.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. A method of estimating a gain of a transmitter in a wireless communication terminal, the transmitter including an upconverter receiving an input signal, a power amplifier receiving a variable supply voltage and operative to amplify an upconverter output, and a downconverter operative to downconvert a power amplifier output, the method comprising:

applying as the input signal to the upconverter a time repetitive signal $u_{mod}(t)$ having a repetition period T and for which an envelope of the input signal $|u_{mod}(t)|$ includes all relevant values within a predetermined range and is a slowly time-varying signal;

applying to the power amplifier the variable supply voltage $V_{PA}$ that is a function of the envelope of the input signal $|u_{mod}(t)|$, wherein the function relating the envelope of the input signal $|u_{mod}(t)|$ to the variable supply voltage $V_{PA}$ is determined by:

sampling the downconverter output $U_{out\_demod}(t)$ m times for each repetition period T, where m is an integer;

for each sampled downconverter output $U_{out\_demod-j}$, time and phase aligning the sampled downconverter output $U_{out\_demod-j}$ with the input signal $u_{mod-j}$ to generate an aligned output $U'_{out\_demod-j}$, where j= 0 ... m−1, wherein $u_{mod-j}$ is the $j^{th}$ sampled point of the input signal $u_{mod}(t)$; and repeating said sampling and said time and phase aligning over k repetition periods, where k is an integer, and wherein in each repetition i where i=0 ... k−1, the variable supply voltage $V_{PA-i}$ has known values as a function $f_i$ of the envelope of the input signal $|u_{mod}(t)|$, using a different function $f_i$ for each repetition;

estimating a gain at each sample point $|G_{i,j}|$ as a function of the envelope of the time aligned output signal $|U_{out\_demod-i,j}'|$ and the envelope of the input signal $|u_{mod-j}|$; and calculating a function f where $V_{PA}=f(|u_{mod}|)$ yields a desired transmitter gain of $|G_0|$ using the gain estimation samples $|G_{i,j}|$.

2. The method of claim 1 wherein the input signal $u_{mod}(t)$ selected as $$u_{mod}(t) = A \cdot \cos\left(\frac{2\pi}{T} \cdot t\right)$$

where
A is a signal amplitude; and
T is the period of repetition.

3. The method of claim 1 further comprising:
calculating a nominal gain $G_{nominal}$ as a root of average nominal output power over one modulation cycle divided by a root of average modulation power over one modulation cycle; and calculating a scaled gain G' by scaling the estimated gain to the nominal gain according to $$G' = \frac{G}{G_{nominal}}.$$

4. The method of claim 1 wherein the downconverter output is related to the input signal and the gain as $U_{out\_demod} = u_{mod}(t) \cdot e^{j((\omega_0 - \omega_0')t + \phi)} \cdot G$ where
   $\omega_0$ is a carrier frequency of the transmitter;
   $\omega_0'$ is a carrier frequency used in the downconverter; and
   $\phi$ is a random phase rotation in the transmitter.

5. The method of claim 1 wherein sampling an integer number of samples of the downconverter output $U_{out\_demod}$ comprises sampling over a plurality of consecutive repetition periods of the input signal.

6. The method of claim 1 further comprising averaging all samples into one or more repetitive periods.

7. The method of claim 4 further comprising, if $\omega_0 \neq \omega_0'$:
   estimating a frequency difference $\omega_0 - \omega_0'$; and
   rotating the samples to compensate for the frequency difference prior to aligning the $U_{out\_demod}$ with the $u_{mod}$.

8. The method of claim 7 wherein estimating the frequency difference comprises:
   averaging, over a number of sample pairs, a calculation $U_{out\_demod}(t) \cdot U^*_{out\_demod}(t+nT)$ where $U^*_{out\_demod}$ denotes the conjugate of the $U_{out\_demod}$ and nT denotes a duration corresponding to n repetitive cycles; and
   calculating the frequency difference as a phase of a complex value given by the averaging, divided by the time nT.

9. The method of claim 8 further comprising rotating the samples by the frequency difference to remove an unwanted rotation of the $U_{out\_demod}$.

10. The method of claim 1 further comprising:
    repeating the steps of claim 1 k times, where k is an integer and wherein for each repetition i where i= 0 . . . k−1, $V_{PA}(i)$ has a known value as a function of an absolute value of the input signal $|u_{mod}|$, wherein the function is different for each repetition i;
    calculating a gain estimation in each repetition i as $$|G(|u_{mod}|)| = \frac{|U'_{out\_demod}|}{|u_{mod}|};$$

and
    after k repetitions, creating a three-dimensional surface wherein an absolute value of the gain estimation as a function of the input signal $|u_{mod}|$ and the variable supply voltage $V_{PA}$ is represented as sample points over the surface.

11. The method of claim 10 wherein the functions $f_i$ relating the $|_{mod}|$ to the $V_{PA}$ are selected such that every function has at least one crossing point with at least one other function.

12. The method of claim 11 further comprising:
    generating a frequency corrected, averaged, time and phase aligned downconverter output $U_{out\_demod}''$ by aligning an unknown phase rotation $\phi$, having different values in each measurement of the $U_{out\_demod}'$, in the crossing points; and calculating a complex gain surface as $$G(|u_{mod}|, V_{PA}) = \frac{U''_{out\_demod}(|u_{mod}|, V_{PA})}{|u_{mod}|}.$$

13. The method of claim 1 wherein a number of the gain estimation samples $|G_{i,j}|$ over the gain surface is an integer value km.

14. The method of claim 1 wherein the input signal $u_{mod}$ and the functions f are selected to cover an uncertainty region of the transmitter gain.

15. The method of claim 1 wherein the function f for $V_{PA} = f(|u_{mod}|)$ yielding a desired transmitter gain of $|G_0|$ for all relevant input signals $u_{mod}$ is calculated using surface interpolation between the gain estimation samples $|G_{i,j}|$.

16. The method of claim 15 further comprising
    at each modulation value j, performing a first one-dimensional interpolation to calculate a supply voltage value $V_{PA}'$ yielding the desired gain $|G_0|$ from among the k gain estimations $$|G_{i,j}| = \frac{|U'_{out\_demod-i,j}|}{|u_{mod-j}|}$$

where i=0 . . . k−1; and
    performing a second one-dimensional interpolation to calculate a supply voltage value $V_{PA}''(u_{mod})$ yielding a desired gain $|G_0|$ for any arbitrarily selected input signal $u_{mod}$ from among the m values of $V_{PA}'(j)$, where j=0 . . . m−1, at sampled points of the $u_{mod}$.

17. The method of claim 16 wherein
    the first one-dimensional interpolation is performed by identifying a sampling point closest to the desired gain $|G_0|$;
    the second one-dimensional interpolation is performed by identifying a sampling point closest to the selected input signal $u_{mod}$;
    for each interpolation, an integer number of samples on each side of the closest points is used as input; and
    statistical behavior of the gain surface is used to determine integer values and interpolation type.

18. The method of claim 17 wherein the interpolation type is linear.

19. The method of claim 17 wherein the interpolation type is cubic spline.

20. The method of claim 1 wherein the function f where $V_{PA} = f(|u_{mod}|)$ yielding a desired transmitter gain $|G_0|$ is calculated for a plurality of $|u_{mod}|$ points and stored in a Look Up Table for use during operation of the transmitter.

21. The method of claim 11 wherein
    the time repetitive input signal $u_{mod}(t)$ has a frequency sufficiently high to identify time delay errors;
    selecting one of the functions $f_i$ relating the $|u_{mod}(t)|$ to the $V_{PA}$ to set the gain $|G| \approx G_0$ for all relevant levels of time invariant $|u_{mod}|$, where $G_0$ is a desired gain value; and
    further comprising calculating from the aligned output $U_{out\_demod}'$ a first distortion component $u_{saturation\_distortion}$ resulting from an inability of the selected function to adequately control the gain, and a second distortion component $u_{delay\_distortion}$ resulting from a time error $\tau$ in the selected function, where $V_{PA} = f(|u_{mod}(t+\tau)|)$.

22. The method of claim 21 further comprising:

dividing $U_{out\_demod}'$ into an odd component $u_{odd}$, where $u_{odd}(t)=-u_{odd}(-t)$, and an even component $u_{even}$, where $u_{even}(t)=u_{even}(-t)$, such that $U_{out\_demod}'(t)=u_{odd}(t)+u_{even}(t)$;

selecting $u_{mod}(t)$ as a pure even function;

calculating $u_{saturation\_distortion}$ as the even part of $U_{out\_demod}'-G_0 u_{mod}$; and calculating $u_{delay\_distortion}$ as the even part of $U_{out\_demod}'-G_0^* u_{mod}$, where $G_0^*$ is the conjugate of $G_0$.

23. The method of claim 22 further comprising calculating a time delay error $\tau$ from the relationship $$u_{delay\_distortion} = -\tau\left(u_{mod} \cdot \frac{d|u_{mod}|}{dt} \cdot \frac{dG(|u_{mod}|)}{d|u_{mod}|}\right).$$

24. The method of claim 23 further comprising, prior to sampling $U_{out\_demod}$:

pre-calculating $$\frac{d|u_{mod}(t)|}{dt}$$

as a function of $u_{mod}(t)$; and pre-calculating $$\frac{dG(|u_{mod}|, V_{PA})}{d|u_{mod}|}$$

using the complex gain surface and selected $V_{PA}=f(|u_{mod}|)$ where the function f yielding a gain of $|G_0|$ is calculated using surface interpolation between gain estimation samples $|G_{i,j}|$.

25. The method of claim 23 further comprising:

inserting a positive or negative time delay $t_{delay}$ into the input signal, $u_{mod}(t+t_{delay})$, prior to applying the input to the upconverter;

adjusting the value of $t_{delay}$ and calculating the resulting time delay error $\tau$; and iteratively repeating the adjusting and calculating steps until the delay error $\tau$ is below a predetermined threshold; and storing the final value of $t_{delay}$ for use by the transmitter during operation.

26. The method of claim 25 further comprising:

for each of M repetitions, where M is an integer, set the time delay $t_{delay}$ to a different value, the range of values over the M repetitions covering an uncertainty region of time delay error; and calculate a time delay error $\tau$, using a set of time delay errors, estimate a function f where $\tau=f(t_{delay})$;

use the function f to calculate a time delay $t_{delay}$ value minimizing the corresponding time delay error $\tau$; and store that time delay $t_{delay}$ value for use by the transmitter during operation.

27. The method of claim 26 wherein estimating a function f where $\tau=f(t_{delay})$ comprises performing a suitable polynomial regression using a least squares method.

28. The method of claim 25 further comprising:

for each of M repetitions, where M is an integer, set the time delay $t_{delay}$ to a different value, the range of values over the M repetitions covering an uncertainty region of time delay error; and calculate a time delay error $\tau$, using a set of time delay errors, estimate a function f where time delay distortion $u_{delay\_distortion}=f(t_{delay})$;

use the function f to calculate a time delay $t_{delay}$ value minimizing the corresponding time delay distortion; and store that time delay $t_{delay}$ value for use by the transmitter during operation.

29. The method of claim 28 wherein estimating a function f where $u_{delay\_distortion}=f(t_{delay})$ comprises performing a suitable polynomial regression using a least squares method.

30. The method of claim 1, further comprising:

estimating a time delay $t_{delay}$ as a function of the input signal $u_{mod}$ and the aligned output $U_{out\_demod}'$, wherein the input signal is delayed by the time delay $t_{delay}$ prior to applying the input signal to the upconverter.

31. The method of claim 1, wherein said time and phase aligning the sampled downconverter output $U_{out\_demod}$ is relative to the input signal $u_{mod}$.

32. A transmitter operative in a wireless communication terminal, comprising:

an upconverter operative to receive an input signal;

a power amplifier receiving a variable supply voltage and operative to amplify an upconverter output; and a downconverter operative to downconvert a power amplifier output; and a baseband processor operative to receive the downconverter output;

wherein the input signal to the upconverter is a time repetitive signal $u_{mod}(t)$ having a repetition period T and for which an envelope of the input signal $|u_{mod}(t)|$ includes all relevant values within a predetermined range and is a slowly time-varying signal;

a variable supply voltage $V_{PA}$ applied to the power amplifier is a function of the envelope of the input signal $|u_{mod}(t)|$;

an integer number of samples of the downconverter output $U_{out\_demod}(t)$ are sampled; and wherein the baseband processor is further operative to:

sample the downconverter output $U_{out\_demod}(t)$ m times for each repetition period T, where m is an integer;

for each sampled downconverter output $U_{out\_demod-j}$, time and phase align the sampled downconverter output $U_{out\_demod-j}$ with the input signal $u_{mod-j}$ to generate an aligned output $U'_{out\_demod-j}$, where j= 0 . . . m−1, wherein $U_{mod-j}$ is the $j^{th}$ sampled point of the input signal $u_{mod}(t)$; and repeat said sampling and said time and phase aligning over k repetition periods, where k is an integer, and wherein in each repetition i where =0 . . . k−1, the variable supply voltage $V_{PA-i}$ has known values as a function $f_i$ of the envelope of the input signal $|u_{mod}(t)|$, using a different function $f_i$ for each repetition;

estimate a gain at each sample point $|G_{i,j}|$ as a function of the envelope of the time aligned output signal $|U_{out\_demod-i,j}'|$ and the envelope of the input signal $|u_{mod-j}|$; and calculate a function f where $V_{PA}=f(|u_{mod}|)$ yields a desired transmitter gain of $|G_0|$ using the gain estimation samples $|G_{i,j}|$.

33. The transmitter of claim 32 wherein the baseband processor is operative to:
repeat the steps of claim 32 k times, where k is an integer and wherein for each repetition i where i=0 . . . k−1, $V_{PA}(i)$ has a known value as a function of an absolute value of the input signal $|u_{mod}|$, wherein the function is different for each repetition i;
calculate a gain estimation in each repetition i as $$|G(|u_{mod}|)| = \frac{|U'_{out\_demod}|}{|u_{mod}|};$$

and
after k repetitions, create a three-dimensional surface wherein an absolute value of the gain estimation as a function of the input signal $|u_{mod}|$ and the variable supply voltage $V_{PA}$ is represented as sample points over the surface.

34. The transmitter of claim 33 wherein functions $f_i$ relating $|u_{mod}|$ to $V_{PA}$ are selected such that every function has at least one crossing point with at least one other function.

35. The transmitter of claim 34 wherein
the time repetitive input signal $u_{mod}(t)$ has a frequency sufficiently high to identify time delay errors;
the function relating $|u_{mod}(t)|$ to $V_{PA}$ is selected to set the gain $|G| \approx G_0$ for all relevant levels of time invariant $|u_{mod}|$, where $G_0$ is a desired gain value; and
wherein the baseband processor is further operative to calculate from the aligned output $U_{out\_demod}'$ a first distortion component $u_{saturation\_distortion}$ resulting from an inability of the function to adequately control the gain, and a second distortion component $u_{delay\_distortion}$ resulting from a time error $\tau$ in the function, where $V_{PA} = f(|u_{mod}(t+\tau)|)$.

36. The transmitter of claim 35 wherein the baseband processor is further operative to:
divide $U_{out\_demod}'$ into an odd component $u_{odd}$, where $u_{odd}(t) = -u_{odd}(-t)$, and an even component $u_{even}$, where $u_{even}(t) = u_{even}(-t)$, such that $U_{out\_demod}'(t) = u_{odd}(t) + u_{even}(t)$;
select $u_{mod}(t)$ as a pure even function;
calculate $u_{saturation\_distortion}$ as the even part of $U_{out\_demod}' - G_0 u_{mod}$; and
calculate $u_{delay\_distortion}$ as the even part of $U_{out\_demod}' - G_0 * u_{mod}$.

37. The transmitter of claim 36 wherein the baseband processor is further operative to calculate a time delay error $\tau$ from the relationship $$u_{delay\_distortion} = -\tau\left(u_{mod} \cdot \frac{d|u_{mod}|}{dt} \cdot \frac{dG(|u_{mod}|)}{d|u_{mod}|}\right).$$

38. The transmitter of claim 37 wherein the baseband processor is further operative to:
insert a positive or negative time delay $t_{delay}$ into the input signal, $u_{mod}(t+t_{delay})$, prior to applying the input to the upconverter;
adjust the value of $t_{delay}$ and calculate the resulting time delay error $\tau$; and
iteratively repeat the adjusting and calculating steps until the delay error $\tau$ is below a predetermined threshold; and
store the final value of $t_{delay}$ for use by the transmitter during operation.

39. A non-transitory computer readable medium having stored thereon instructions operative to cause a processing circuit in a User Equipment featuring a transmitter including an upconverter receiving an input signal, a power amplifier receiving a variable supply voltage and operative to amplify the upconverter output, and a downconverter operative to demodulate the amplifier output, to perform the steps of:
applying as the input signal to the upconverter a time repetitive signal $u_{mod}(t)$ having a repetition period T and for which an envelope of the input signal $|u_{mod}(t)|$ includes all relevant values within a predetermined range and is a slowly time-varying signal;
applying to the power amplifier a variable supply voltage $V_{PA}$ that is a function of the envelope of the input signal $|u_{mod}(t)|$, wherein the function relating the envelope of the input signal $|u_{mod}(t)|$ to the variable supply voltage $V_{PA}$ is determined by:
sampling the downconverter output $U_{out\_demod}(t)$ m times for each repetition period T, where m is an integer;
for each sampled downconverter output $U_{out\_demod-j}$, time and phase aligning the sampled downconverter output $U_{out\_demod-j}$ with the input signal $u_{mod-j}$ to generate an aligned output $U'_{out\_demod-j}$, where j= 0 . . . m−1, wherein $u_{mod-j}$ is the $j^{th}$ sampled point of the input signal $u_{mod}(t)$; and
repeating said sampling and said time and phase aligning over k repetition periods, where k is an integer, and wherein in each repetition i where i=0 . . . k−1, the variable supply voltage $V_{PA-i}$ has known values as a function $f_i$ of the envelope of the input signal $|u_{mod}(t)|$, using a different function $f_i$ for each repetition;
estimating a gain at each sample point $|G_{i,j}|$ as a function of the envelope of the time aligned output signal $|U'_{out\_demod-i,j}|$ and the envelope of the input signal $|u_{mod-j}|$; and
calculating a function f where $V_{PA} = f(|u_{mod}|)$ yields a desired transmitter gain of $|G_0|$ using the gain estimation samples $|G_{i,j}|$.

40. The computer readable medium of claim 39 wherein the instructions are further operative to cause the processing circuit to perform the steps of:
calculating the gain estimation in each calculation as $$|G(|u_{mod}|)| = \frac{|U'_{out\_demod}|}{|u_{mod}|};$$

and
creating a three-dimensional surface wherein an absolute value of the gain as a function of the $|u_{mod}|$ and the $V_{PA}$ is represented as sample points over the surface.

41. The computer readable medium of claim 40 wherein functions $f_i$ relating $|u_{mod}|$ to $V_{PA}$ are selected such that every function has at least one crossing point with at least one other function.

42. The computer readable medium of claim 41 wherein
the time repetitive input signal $u_{mod}(t)$ has a frequency sufficiently high to identify time delay errors;
the function relating $|u_{mod}(t)|$ to $V_{PA}$ is selected to set the gain $|G| \approx G_0$ for all relevant levels of time invariant $|u_{mod}|$, where $G_0$ is a desired gain value; and
wherein the instructions are further operative to cause the processing circuit to perform the steps of calculating from the aligned output $U_{out\_demod}'$ a first distortion component $u_{saturation\_distortion}$ resulting from an inability of the function to adequately control the gain, and a second distortion component $u_{delay\_distortion}$ resulting from a time error $\tau$ in the function, where $V_{PA}=f(|u_{mod}(t+\tau)|)$.

43. The computer readable medium of claim 42 wherein the instructions are further operative to cause the processing circuit to perform the steps of:
dividing $U_{out\_demod}'$ into an odd component $u_{odd}$, where $u_{odd}(t)=-u_{odd}(-t)$, and an even component $u_{even}$, where $u_{even}(t)=u_{even}(-t)$, such that $U_{out\_demod}'(t)=u_{odd}(t)+u_{even}(t)$;
selecting $u_{mod}(t)$ as a pure even function;
calculating $u_{saturation\_distortion}$ as the even part of $U_{out\_demod}'-G_0 u_{mod}$; and
calculating $u_{delay\_distortion}$ as the even part of $U_{out\_demod}'-G_0*u_{mod}$.

44. The computer readable medium of claim 43 wherein the instructions are further operative to cause the processing circuit to perform the step of calculating a time delay error $\tau$ from the relationship $$u_{delay\_distortion} = -\tau \left( u_{mod} \cdot \frac{d|u_{mod}|}{dt} \cdot \frac{dG(|u_{mod}|)}{d|u_{mod}|} \right).$$

45. The computer readable medium of claim 44 wherein the instructions are further operative to cause the processing circuit to perform the steps of:
inserting a positive or negative time delay $t_{delay}$ into the input signal, $u_{mod}(t+t_{delay})$, prior to applying the input to the upconverter;
adjusting the value of $t_{delay}$ and calculating the resulting time delay error $\tau$; and
iteratively repeating the adjusting and calculating steps until the delay error $\tau$ is below a predetermined threshold; and
storing the final value of $t_{delay}$ for use by the transmitter during operation.

* * * * *